(12) United States Patent
Muller

(10) Patent No.: US 7,884,002 B2
(45) Date of Patent: Feb. 8, 2011

(54) METHOD OF FABRICATING SELF ALIGNED SCHOTTKY JUNCTIONS FOR SEMICONDUCTOR DEVICES

(75) Inventor: Markus Muller, Grenoble (FR)

(73) Assignee: NXP B.V., Eindhoven (NL)

( * ) Notice: Subject to any disclaimer, the term of this patent is extended or adjusted under 35 U.S.C. 154(b) by 308 days.

(21) Appl. No.: 12/095,144

(22) PCT Filed: Nov. 27, 2006

(86) PCT No.: PCT/IB2006/054446

§ 371 (c)(1),
(2), (4) Date: May 28, 2008

(87) PCT Pub. No.: WO2007/060641

PCT Pub. Date: May 31, 2007

(65) Prior Publication Data

US 2008/0299715 A1    Dec. 4, 2008

(30) Foreign Application Priority Data

Nov. 28, 2005    (EP)    .................. 05300971

(51) Int. Cl.
     *H01L 21/28*    (2006.01)
     *H01L 21/8238*    (2006.01)
     *H01L 21/4763*    (2006.01)
     *H01L 21/44*    (2006.01)

(52) U.S. Cl. ............................ 438/571; 257/E29.271; 257/E29.311; 438/199; 438/621; 438/675

(58) Field of Classification Search .................. 438/570, 438/571; 257/E29.271, E29.311
See application file for complete search history.

(56) References Cited

U.S. PATENT DOCUMENTS

| 6,018,185 | A | * | 1/2000 | Mitani et al. | ................. 257/374 |
| 2002/0127787 | A1 | * | 9/2002 | Huang et al. | ................. 438/172 |
| 2002/0155721 | A1 | * | 10/2002 | Wang et al. | ................. 438/700 |
| 2002/0179980 | A1 | * | 12/2002 | Yagishita et al. | ............ 257/384 |
| 2003/0045039 | A1 | | 3/2003 | Shin et al. | |
| 2005/0212055 | A1 | | 9/2005 | Nakabayashi et al. | |
| 2006/0011986 | A1 | * | 1/2006 | Yagishita | .................... 257/369 |
| 2006/0252191 | A1 | * | 11/2006 | Kammler et al. | ............ 438/197 |

FOREIGN PATENT DOCUMENTS

DE    102004012630 A1    6/2005

\* cited by examiner

*Primary Examiner*—Hsien-ming Lee
*Assistant Examiner*—Kevin Parendo

(57) ABSTRACT

A method of fabricating a self-aligned Schottky junction (29) in respect of a semiconductor device. After gate etching and spacer formation, a recess defining the junction regions is formed in the Silicon substrate (10) and a SiGe layer (22) is selectively grown therein. A dielectric layer (24) is then provided over the gate (14) and the SiGe layer (22), a contact etch is performed to form contact holes (26) and the SiGe material (22) is then removed to create cavities (28) in the junction regions. Finally the cavities (28) are filled with metal to form the junction (29). Thus, a process is provided for self-aligned fabrication of a Schottky junction having relatively low resistivity, wherein the shape and position of the junction can be well controlled.

17 Claims, 4 Drawing Sheets

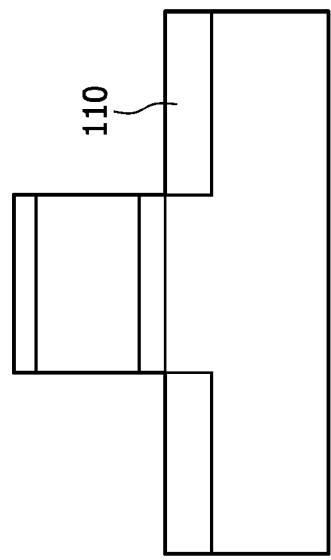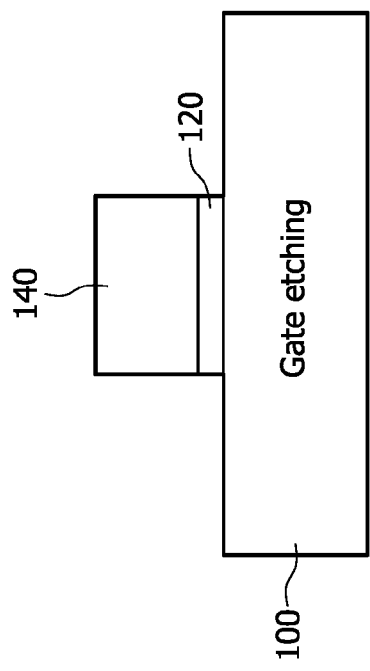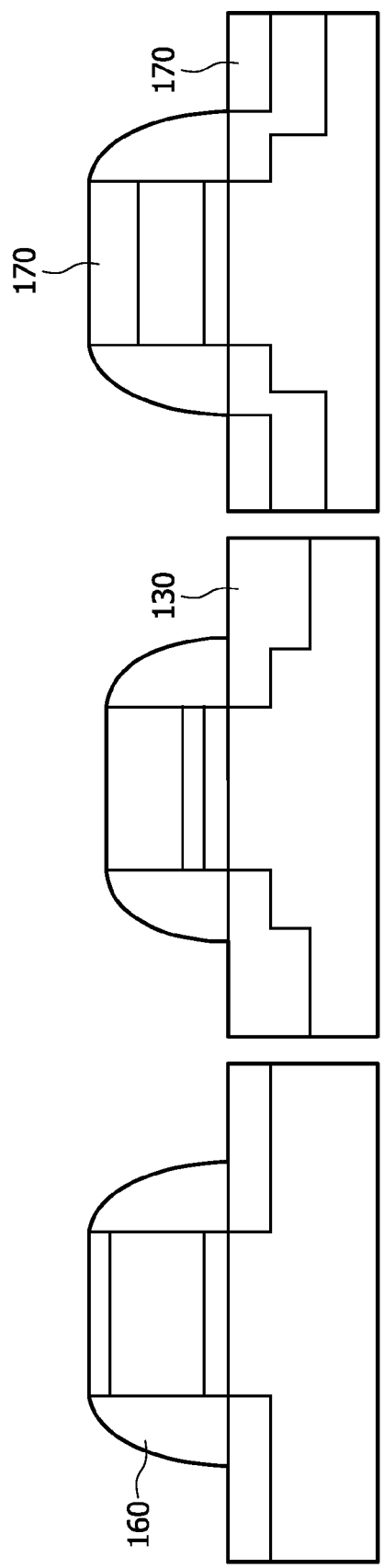

METHOD OF FABRICATING SELF ALIGNED SCHOTTKY JUNCTIONS FOR SEMICONDUCTOR DEVICES

FIELD OF THE INVENTION

The invention relates to a method of fabricating self-aligned Schottky junctions for semiconductor devices.

BACKGROUND OF THE INVENTION

The development of Very Large Scale Integration (VLSI) is evolving along the line of a large wafer size and a small line width. This trend of development enhances the function of integrated circuits and reduces manufacturing costs. As the dimensions of semiconductor devices, such as complementary metal-oxide semiconductor (CMOS) transistors, are reduced, the channel length diminishes correspondingly to increase the operating speed of the transistor. As the dimensions of CMOS transistors are scaled down to 0.1 μm and below, in order to achieve continued improvements in integrated circuit density and performance, a significant number of new technological issues emerge. One of these is the scaling of the junctions. The junction depth $x_j$ needs to be scaled down in order to control the Short Channel Effect and Drain Induced Barrier Lowering, which may be detrimental to good transistor switching behavior.

Conventionally, the junctions are formed by impurity implantation and subsequent annealing. However, as the total number of activated atoms is limited by the solubility curve, a decrease of the junction depth automatically increases the access resistance $R_j$ of the transistor. Moreover, it is very difficult to achieve well-defined and abrupt junctions by the process described above, due to scattering events during implantation and diffusion during activation. A way to overcome this $R_j/x_j$ trade-off is to manufacture metallic Schottky junctions, which present a far lower resistivity. Conventionally, such junctions is achieved by a silicidation process because of its selectivity.

Referring to FIG. 9a of the drawings, in a prior art metal-oxide semiconductor device fabrication process, a gate 140 is formed over a gate oxide layer 120 on a substrate 100. Next, an ion implantation step is performed in respect of the substrate 100 to form lightly doped drain (LDD) regions 110, as illustrated schematically in FIG. 9b of the drawings. A spacer 160 is formed on the sidewall of the gate 140, as shown in FIG. 9c, and a source/drain (S/D) implantation process is performed to form a source/drain region 130 in the substrate 100, as shown in FIG. 9d. Finally, following the subjection of the silicon wafer to a thermal process (such as annealing) to repair the crystal structure and drive in the dopants, silicide contacts 170 (or junctions) are formed on the source, drain and gate regions of the device by means of a silicidation step, to create a structure as illustrated schematically in FIG. 9e of the drawings.

In order to use the full potential of a metal Schottky junction, the control of the shape of the junction and of its position relative to the gate-controlled channel is of extreme importance. However, if a conventional silicidation process is used to form the junction, unwanted diffusion phenomena into the substrate or under the gate can occur during the metal-silicon reaction, such that the shape and position of the resultant junction may be adversely affected. On the other hand, a metal deposition process has been considered for forming the junction, which may overcome the problems outlined above and also widen the choice of possible Schottky materials that might be used. However, in contrast to silicidation, metal deposition is not selective to silicon and it is therefore desirable to provide a method of forming such junctions using metal deposition without causing metal to be deposited on other parts of the transistor, such as the spacers or STI region, which would inevitably cause short circuits.

It is preferred to provide a method of fabricating a self-aligned metal junction in respect of a semiconductor device, using a metal deposition process, as opposed to the silicidation techniques proposed in the prior art, wherein at least some of the problems outlined above are addressed.

SUMMARY OF THE INVENTION

In one aspect of the present invention, there is provided a method of fabricating a self-aligned metal-semiconductor junction in respect of an active region of a semiconductor device, the method comprising the steps of:

providing a gate on a semiconductor substrate;

selectively depositing a layer of sacrificial material on said active region, said material defining a junction region;

providing a layer of dielectric material over said gate and said sacrificial material;

selectively etching said dielectric material at said junction region to form a contact hole;

subsequently removing said sacrificial material from said recess to create a cavity; and filling said cavity with a metallic material via said contact hole.

Thus, the above-mentioned object is achieved in accordance with the present invention by forming a semiconductor "dummy" junction which is subsequently selectively removed to create a cavity or void that is then filled with metal to form the junction.

In a preferred embodiment of the invention, the method further comprises the step of removing a portion of material from the surface of said semiconductor substrate corresponding to said active region so as to form a recess therein, said recess defining the junction region. This etching of a recess is in particular advantageous as in this way, the junctions are placed at the level of the conductive channel under the gate. Furthermore, when the gate is flanked by spacers, this embodiment enables to etch under the spacers (when e.g. done wet), so the sacrificial material and the later junction can be placed under the spacers, close to the channel.

In an exemplary embodiment, said portion of material may be removed from the surface of said semiconductor substrate by means of a wet and/or dry etching process. Preferably, said semiconductor substrate comprises silicon and said layer of semiconductor material selectively grown on said semiconductor substrate, in said recess, is Silicon Germanium (SiGe), which is beneficially grown by means of SiGe epitaxy. In one exemplary embodiment, the gate comprises polysilicon, and the SiGe layer is also grown on top of said gate. The semiconductor material may be removed from the recess by means of a selective chemical etch, e.g. a selective chemical SiGe etch in the case that the so-called "dummy" junction is formed of SiGe. In a preferred embodiment, the layer of semiconductor material in the recess extends higher than the original surface of the semiconductor substrate (prior to formation of the recess). This aids the Schottky metal deposition step and also has the effect of reducing the resistivity of the final junction.

In a preferred embodiment, the step of filling the cavity with metallic material via the contact hole comprises sub-steps of first performing a metal deposition process so as to fill the cavity and cover the sidewalls of the contact hole and the surface of the dielectric material with a layer of metal, and subsequently filling the remainder of the contact hole substantially full of metal. In this case, the method may comprise an additional (e.g. CMP) step to remove the deposited layer of metal from the surface of the dielectric. The metal used to form the junction (e.g. TiN) is beneficially substantially unreactive with said semiconductor substrate material below a predetermined temperature defined by the maximum temperature of the process flow for fabricating said semiconductor device.

In one exemplary embodiment of the present invention, the semiconductor device may comprise a MOS transistor having a source and drain region, wherein a metal junction fabricated in accordance with the method defined above is provided in respect of the source region and drain regions. In one exemplary embodiment, the semiconductor device may comprise a CMOS transistor, comprising a pMOS device and an nMOS device, wherein different metals may be used to form the respective metal junctions of the pMOS and nMOS devices. In this case, the thicknesses of the respective metal junctions of the pMOS and nMOS devices may also be different. In one exemplary embodiment of the present invention, in order to achieve the above-mentioned difference in junction thickness, separate respective contact etch steps may be used to form the respective contact holes of the pMOS and nMOS devices.

The present invention extends to an integrated circuit comprising a substrate on which is provided at least one semiconductor device incorporating a metal-semiconductor junction fabricated in accordance with the method defined above.

BRIEF DESCRIPTION OF THE FIGURES

These and other aspects of the present invention will be apparent from, and elucidated with reference to, the embodiments described herein.

Embodiments of the present invention will now be described by way of examples only and with reference to the accompanying drawings, in which:

FIGS. 9a to 9e are schematic cross-sectional drawings illustrating the main process flow steps for fabricating a metal-oxide semiconductor device according to the prior art.

DETAILED DESCRIPTION OF EMBODIMENT

Figure 1:
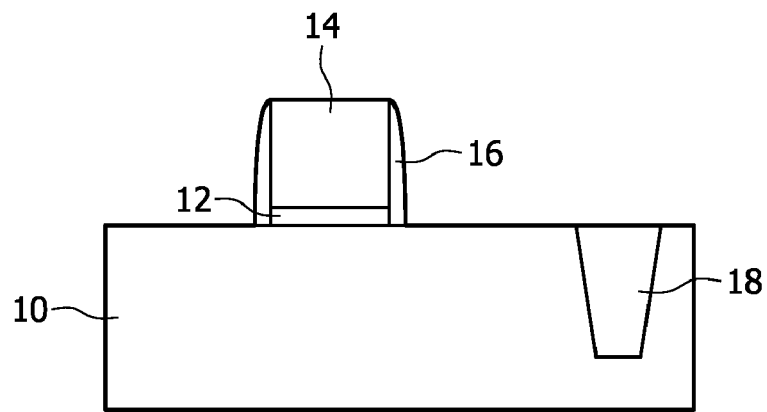
FIGS. 1 to 8 are schematic cross-sectional drawings illustrating the principal steps of a method according to an exemplary embodiment of the present invention for fabricating a metal-semiconductor junction in respect of a semiconductor device.

A method according to the present invention starts with a normal CMOS transistor fabrication process which follows the normal process flow up to, and including, the gate etching step. Thus, referring to FIG. 1 of the drawings, a semiconductor substrate 10 is provided in which a shallow trench isolation (STI) region 18 is provided, and in which an N-well and P-well (not shown) have been implanted. A gate oxide layer 12 is provided on the substrate 10 and a layer of gate electrode material, such as polysilicon or the like, is deposited over the gate oxide layer 12 and then etched to form a gate 14. A spacer 16 is provided on the sidewall of the gate 14.

Figure 2:
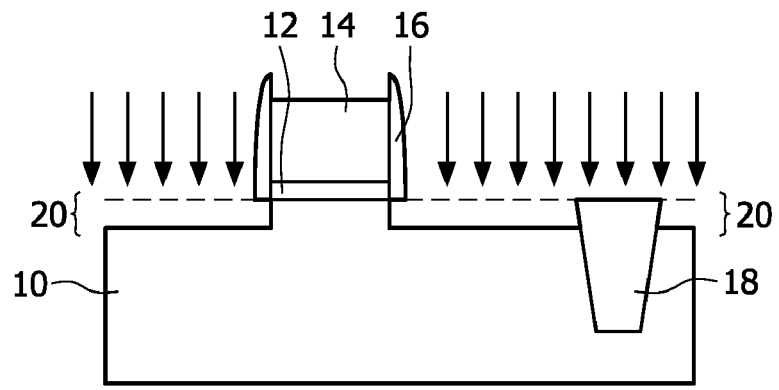

Referring to FIG. 2 of the drawings, using an appropriate sequence of dry and wet etching processes, a well-defined recess 20 is formed in the silicon substrate 10, at the junction regions, which recess defines the lower limit of the Schottky junctions to be formed.

Ideally, the Schottky junction reaches the edges of the gate 14 in order to minimize the contact resistance of the channel.

Thus, in this exemplary embodiment of the invention, semi-isotropic etching may be advantageously used to provide sufficient recesses (20) under the spacer 16 to be filled later with metal. Typically, anisotropic etching is achieved by Reactive Ion Etching (RIE) and isotropic etching by chemical etching, e.g. wet etching. However, semi-isotropic etching can also be achieved by dry etching at very low ion energies, thus reducing the directionality of the abrasion. It will be appreciated by a person skilled in the art that there may be several other ways of etching the recesses 20, and the present invention is not necessarily intended to be limited in this regard.

Figure 3:
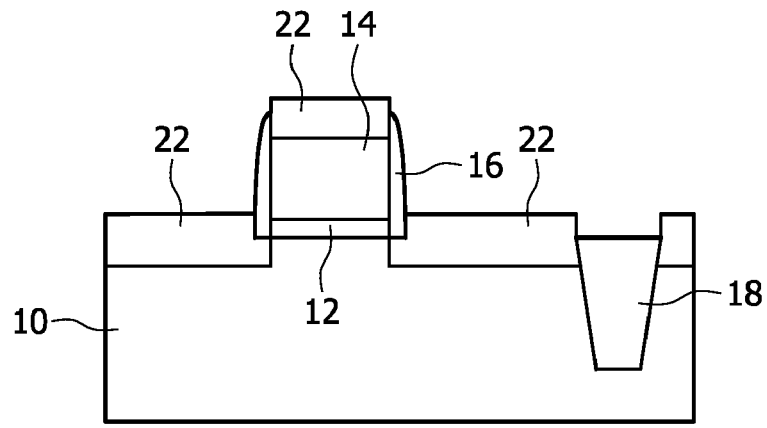

Next, selective SiGe epitaxy is used to grow a SiGe layer 22 on the source and drain regions of the device and, if a polysilicon gate 14 is used, also on the gate, as shown in FIG. 3. The Ge content used is typically 15-30% to guarantee a high selectivity during a later selective SiGe etching step (a higher Ge content increases the selectivity for the SiGe removal with respect of Si but leads also to undesirable losses of SiGe during cleaning steps). The SiGe layers 22 act as "dummy" junctions and define the upper limit of the Schottky junctions to be formed. It is advantageous to perform the selective SiGe epitaxy growth so as to form SiGe layers 22 that extend higher than the original substrate surface, as shown in FIG. 3, as this aids the Schottky metal deposition step. This is because the SiGe thickness defines the height of the cavity in which the metal will be deposited, and should not be too small to assure conformal filling of the cavity (i.e. reduce the risk of incomplete filling after inhomogeneous deposition on the sidewalls). A thicker junction also has the effect of reducing the resistivity. It will be appreciated that the LDD and S/D implantation steps and the silicidation step of the prior art process are not required for this exemplary method.

Figure 4:
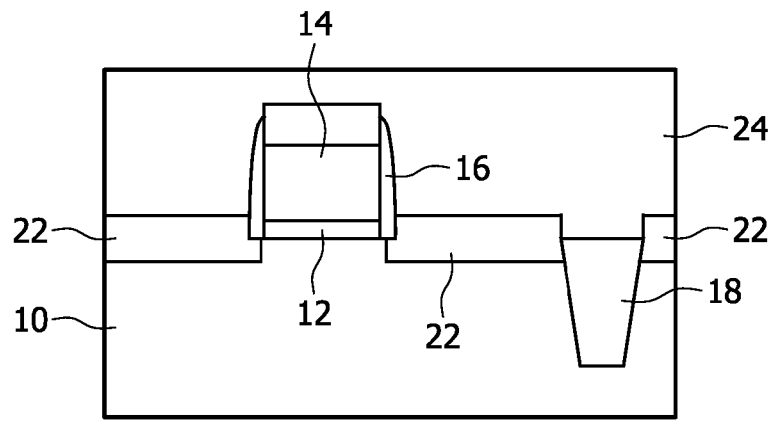
Figure 5:
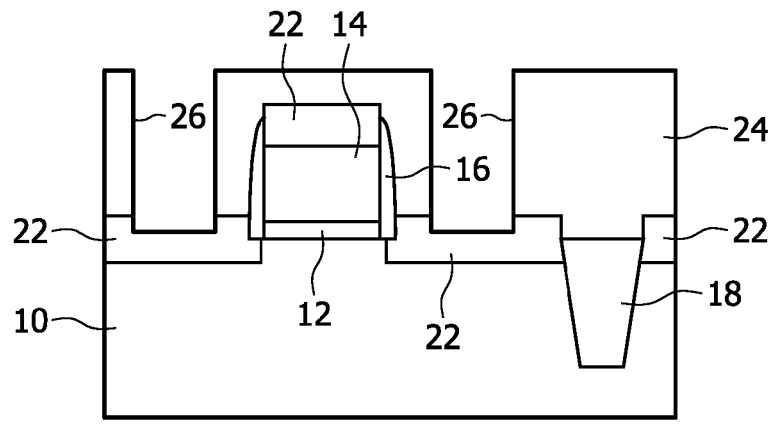

Referring to FIG. 4 of the drawings, the semiconductor device is covered with a layer 24 of dielectric material, and the dielectric material 24 is then selectively etched to form contact holes 26 in respect of the source and drain regions of the device, as illustrated in FIG. 5. Any dielectric material may be used: a normal CMOS transistor flow uses a thick layer 30 nm) of nitride capping in the active areas and acting as etch stop layer for the contact etching on which oxide e.g. Phospherous spin glass (PSG) is deposited. The present invention is not necessarily intended to be limited in this regard.

Figure 6:
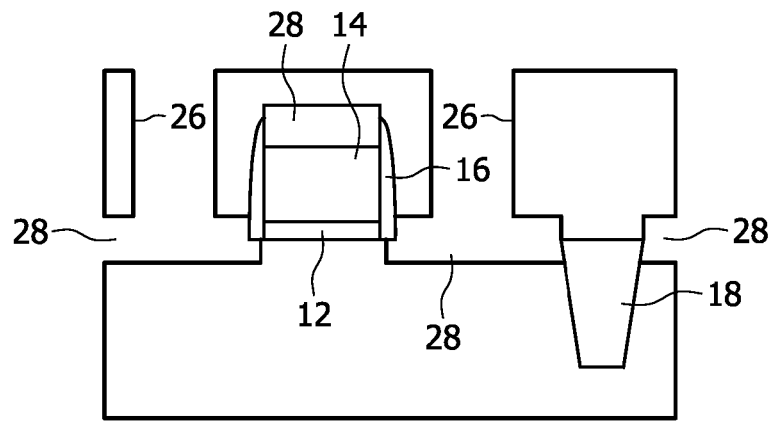

After contact etching, a selective chemical SiGe etch, known in the art, is performed to remove all of the SiGe from the junction regions and, in the case of a polysilicon gate 14, from the top of the gate, to create cavities or voids 28, as shown in FIG. 6. Wet etching techniques may alternatively be used for this step. As the SiGe grown is removed again, a person skilled in the art will appreciate that also other materials may be used for this sacrificial layer. These other materials can be deposited by epitaxy as well, or other known deposition methods like PVD, CVD, ALD.

Figure 7:
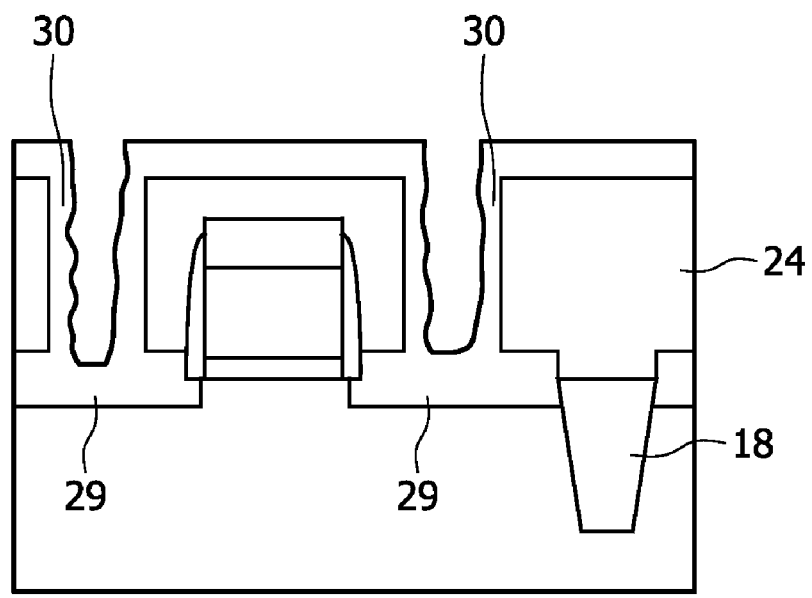
Figure 8:
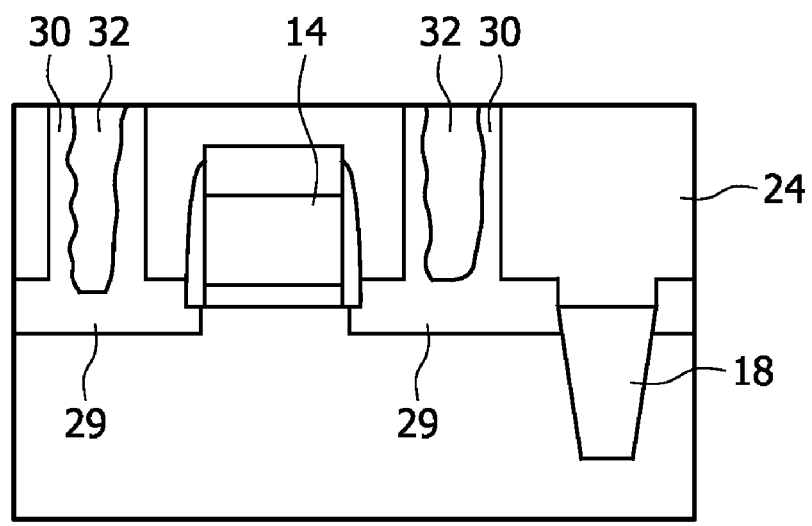

Next, a metal deposition process is used to deposit a metal layer 30, via the contact holes 26, to fill the voids 28 and form junctions 29, as shown in FIG. 7 of the drawings. The metal 30 (e.g. TiN) should advantageously be such that it does not react, or at least only superficially reacts, at a depth of several Angstroms, with silicon during the deposition process and during the remaining middle end and back end steps, where the maximum process temperature is normally below 450° C., in order to ensure that the predefined junction geometry is maintained. The contact holes 26 are then completely filled with an appropriate metal 32 and a chemical mechanical polishing (CMP) step is used to remove all excess metal from the surface of the dielectric layer 24, as shown in FIG. 8. In a normal process flow, W is used to contact filling after barrier deposition. In the present invention, it is advantageous for the metal for the Schottky barrier to fulfil the role of the barrier material, so there are not necessarily any special requirements for the contact-filling material. If not, an additional deposition of a barrier material may be needed to avoid W diffusion. In general, the selection criteria for the contact-filling material include low resistivity, low contact resistivity on the barrier material and the availability of a conformal deposition method (ALD, MOCVD or other) for homogeneous contact filling without leaving voids.

The device can then be finished by means of a conventional Multi-Level Metallisation back end, which will be familiar to a person skilled in the art, and will not be discussed further herein.

In summary, the above-described exemplary embodiment of the present invention aims to provide a method of fabricating self-aligned Schottky junctions in CMOS devices by metal deposition through source/drain contact holes after selective removal of a previously-built SiGe "dummy" junction. By means of this approach, the geometry of the Schottky junctions to be formed is defined by a deliberate Si substrate recess after gate etching and selective SiGe epitaxy in the source/drain areas, which gives more flexibility in the geometrical design and, in the case of a non-reactive metal, also better shape and depth control of the Schottky junction with respect to the silicidation techniques conventionally proposed for the fabrication of Schottky junctions.

It is acknowledged to be advantageous to use two different metals with different barrier heights for Schottky junctions on p and nMOS devices respectively. This can be achieved in accordance with an exemplary embodiment of the present invention by an additional mask step separating the contact etching steps for the p and nMOS devices respectively. This increase in complexity relative to the simpler process flow described above with reference to FIGS. 1 to 8 would be practically acceptable, as the LDD and S/D implantation the silicidation steps of the prior art are still omitted.

It should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. The invention may be implemented by means of hardware comprising several distinct elements, and by means of a suitably programmed computer. In a device claim enumerating several means, several of these means may be embodied by one and the same item of hardware. The mere fact that certain measures are recited in mutually different dependent claims does not indicate that a combination of these measures cannot be used to advantage.

A person skilled in the art will readily appreciate that various parameters disclosed in the description may be modified and that various embodiments disclosed and/or claimed may be combined without departing from the scope of the invention.

The invention claimed is:

1. A method of fabricating a self-aligned metal-semiconductor junction of an active region of a semiconductor device, the method comprising the steps of:

forming a gate on a semiconductor substrate;

after the step of forming the gate, selectively growing a layer of sacrificial material in a junction region of said semiconductor device;

providing a layer of dielectric material over said gate and said sacrificial material;

selectively etching said dielectric material above said junction region to form a contact hole;

removing substantially all of said sacrificial material to create a cavity; and filling said cavity with a metallic material via said contact hole to form a junction in said junction region.

2. A method as claimed in claim 1, further comprising the step of removing a portion of material from the surface of said semiconductor substrate corresponding to said active region so as to form a recess therein, said recess forming at least part of the junction region.

3. A method according to claim 2, wherein said portion of material is removed from the surface of said semiconductor substrate by means of a wet and/or dry etching process.

4. A method according to claim 2, wherein the layer of sacrificial material extends higher than the original surface of the semiconductor substrate prior to formation of the recess.

5. A method as claimed in claim 2, wherein the layer of sacrificial material comprises a semiconductor material.

6. A method according to claim 5, wherein said semiconductor substrate comprises silicon and said semiconductor material that is deposited on said semiconductor substrate is a silicon germanium (SiGe) layer and wherein the deposition is done by epitaxy.

7. A method according to claim 6, wherein said SiGe layer is grown in said recess.

8. A method according to claim 6, wherein said gate comprises polysilicon, and the SiGe layer is also grown on top of said gate.

9. A method according to claim 6, wherein said SiGe layer is removed from said recess by means of a selective chemical SiGe etch.

10. A method according to claim 2, wherein said layer of sacrificial material is removed from the recess by means of a selective chemical etch.

11. A method according to claim 1, wherein the step of filling the cavity with metallic material via the contact hole comprises sub-steps of first performing a metal deposition process so as to fill the cavity and cover the sidewalls of the contact hole and the surface of the dielectric material with a layer of metal, and subsequently filling the remainder of the contact hole substantially full of metal.

12. A method according to claim 1, further comprising the step of removing the metallic material from the surface of the layer of dielectric material.

13. A method according to claim 1, wherein the metallic material used to form the junction is substantially unreactive with said semiconductor substrate material below a predetermined temperature defined by a maximum temperature of a process flow for fabricating said semiconductor device.

14. A method according to claim 1, wherein said semiconductor device comprises a CMOS transistor comprising a pMOS and a nMOS device, wherein different metallic materials are used to form respective junctions of the pMOS and nMOS devices.

15. A method according to claim 14, wherein separate contact etch steps are used to form respective contact holes of the pMOS and nMOS devices.

16. A method according to claim 1, wherein said semiconductor device comprises a CMOS transistor comprising a pMOS and a nMOS device, wherein a first thickness of a junction of the pMOS device is different than a second thickness of a junction of the nMOS device.

17. A method of fabricating a self-aligned metal-semiconductor junction of a semiconductor device, the method comprising:

forming a gate on a semiconductor substrate;

removing a portion of material from the surface of said semiconductor substrate corresponding to said active region so as to form a recess therein, said recess forming at least part of a junction region of said semiconductor device;

selectively growing a layer of sacrificial material in said junction region;

providing a layer of dielectric material over said gate and said sacrificial material;

selectively etching said dielectric material above said junction region to form a contact hole;

removing substantially all of said sacrificial material to create a cavity; and filling said cavity with a metallic material via said contact hole to form a junction in said junction region;

wherein the layer of sacrificial material extends higher than the original surface of the semiconductor substrate prior to formation of the recess.

* * * * *